United States Patent [19]

Kitano

[11] Patent Number: 5,486,710

[45] Date of Patent: Jan. 23, 1996

[54] FIELD EFFECT TRANSISTOR

[75] Inventor: Toshiaki Kitano, Itami, Japan

[73] Assignee: Mitsubishi Denki Kabushiki Kaisha, Tokyo, Japan

[21] Appl. No.: 385,089

[22] Filed: Feb. 7, 1995

Related U.S. Application Data

[63] Continuation of Ser. No. 133,378, Oct. 8, 1993, abandoned.

[30] Foreign Application Priority Data

| Oct. 9, 1992 | [JP] | Japan | 4-298136 |
| Mar. 16, 1993 | [JP] | Japan | 5-055252 |

[51] Int. Cl.$^6$ ............... H01L 31/0328; H01L 29/80; H01L 31/112

[52] U.S. Cl. .......... 257/192; 257/194; 257/279; 257/284

[58] Field of Search ............... 257/408, 192, 257/194, 623, 355, 356, 279, 280, 281, 282, 283, 284, 476

[56] References Cited

U.S. PATENT DOCUMENTS

| 4,244,097 | 1/1981 | Cleary | 29/571 |
| 4,782,031 | 11/1988 | Hagio et al. | 437/39 |
| 4,799,088 | 1/1989 | Hiyamizu et al. | 257/194 |
| 4,984,036 | 1/1991 | Sakamoto et al. | 257/284 |
| 5,028,968 | 7/1991 | O'Loughlin et al. | 257/194 |
| 5,091,759 | 2/1992 | Shih et al. | 257/192 |

FOREIGN PATENT DOCUMENTS

| 0492666 | 7/1992 | European Pat. Off. . | |
| 2646290 | 10/1990 | France | 257/194 |
| 58-147170 | 9/1983 | Japan . | |
| 61-214473 | 9/1986 | Japan | 257/408 |
| 1-61063 | 3/1989 | Japan | 257/284 |
| 1161873 | 6/1989 | Japan . | |
| 2139941 | 5/1990 | Japan . | |
| 3192732 | 8/1991 | Japan . | |
| 4186640 | 3/1992 | Japan . | |

OTHER PUBLICATIONS

H. M. Macksey, "GaAs Power FET's . . . than the Gate", IEEE Electron Device Letters, vol. EDL-7, No. 2, Feb. 1986, pp. 69 & 70.

Hagio et al., "A New Self-Align . . . Analog MMIC's", IEEE Electron Devices, vol. ED-33, No. 6, Jun. 1986, pp. 754–758.

Ito et al., "A Self-Aligned Planar . . . for MMICs", IEEE GaAs IC Symposium, pp. 45–48.

R. Yeats et al., "Gate Slow Transients in GaAs MESFETs . . . Impact on Circuits", IEDM (International Electron Devices meeting), pp. 842–846.

Canfield et al, "Suppression Of Drain Conductance Transients, Drain Current Oscillations, And Low-Frequency Generation-Recombination Noise In GaAs FET's Using Buried Channels", IEEE Transactions on Electron Devices, vol. ED-3, No. 7, Jul. 1986, pp. 925–928.

*Primary Examiner*—Wael M. Fahmy
*Attorney, Agent, or Firm*—Leydig, Voit & Mayer

[57] ABSTRACT

A field effect transistor includes a semi-insulating GaAs substrate; source, gate, and drain electrodes disposed on a surface of the GaAs substrate; a low carrier concentration active region disposed in the GaAs substrate lying beneath the gate electrode; intermediate carrier concentration regions disposed in the GaAs substrate at opposite sides of and in contact with the low carrier concentration active region; high carrier concentration source and drain regions disposed in the GaAs substrate at opposite sides of and in contact with the intermediate carrier concentration regions and lying beneath the source and drain electrodes, respectively; and first and second high carrier concentration regions having a carrier concentration as high as or higher than that of the high carrier concentration source and drain regions. The first and second high carrier concentration regions are disposed in the intermediate carrier concentration regions and reach the surface. In this structure, extension of a surface depletion layer in the vicinity of the gate is restricted to the first and second high carrier concentration regions, so that the depletion layer and surface levels do not adversely affect device characteristics.

6 Claims, 16 Drawing Sheets

FIELD EFFECT TRANSISTOR

This disclosure is a continuation of Application Ser. No. 08/133,378, filed Oct. 8, 1993, now abandoned.

FIELD OF THE INVENTION

The present invention relates to field effect transistors and, more particularly, to a field effect transistor in which a surface depletion layer that is produced in the vicinity of a gate electrode and affects device characteristics is controlled to suppress a gate pulse response delay, an increase in source resistance (Rs), and a channel concentration due to a large signal input. The invention also relates to a method for producing the field effect transistor.

BACKGROUND OF THE INVENTION

FIG. 7 is a sectional view illustrating a typical lightly doped drain field effect transistor (hereinafter referred to as LDD-FET). In FIG. 7, reference numeral 1 designates a semi-insulating GaAs substrate. A gate electrode 4, a source electrode 2, and a drain electrode 3 are disposed on the GaAs substrate 1. An n type low carrier concentration GaAs region (hereinafter referred to as n type GaAs region) 6 serving as a channel region is disposed within the GaAs substrate 1 lying below the gate electrode 4. N type high carrier concentration GaAs regions (hereinafter referred to as $n^+$ type GaAs regions) 8a and 8b serving as source and drain regions are disposed within the GaAs substrate 1 lying below the source electrode 2 and the drain electrode 3, respectively. N type intermediate concentration GaAs regions (hereinafter referred to as n' type GaAs regions) 7 are disposed between the $n^+$ type GaAs source and drain regions 8a and 8b surrounding the n type GaAs region 6.

FIGS. 8(a) to 8(d) are sectional views schematically illustrating a method for fabricating the LDD-FET of FIG. 7. In the figures, reference numeral 9 designates an SiON film.

Initially, as illustrated in FIG. 8(a), Si ions are implanted into the semi-insulating GaAs substrate 1 to form the n type active region 6. Then, the gate electrode 4 is formed on a part of the active region 6 using a refractory metal, such as WSi (tungsten silicide).

In the step of FIG. 8(b), using the gate electrode 4 as a mask, Si ions are implanted to form the n' type region 7.

In the step of FIG. 8(c), an SiON film 9 is deposited on the gate electrode 4 and on the n' type region 7, and Si ions are implanted to form the $n^+$ type region 8.

After removing the SiON film 9, the source and drain electrodes 2 and 3 are formed on the $n^+$ type region 8 with a prescribed spacing, completing the LDD-FET as shown in FIG. 8(d).

FIG. 9 is a sectional view illustrating a conventional FET having a gate recess (hereinafter referred to as recessed gate FET). In FIG. 9, the same reference numerals as in FIG. 7 designate the same or corresponding parts. Reference numeral 10 designates a recess. FIGS. 10(a)-10(d) illustrate process steps for fabricating the FET of FIG. 9.

Initially, as illustrated in FIG. 10(a), Si ions are implanted into a prescribed region of a semi-insulating GaAs substrate 1 to form an n type semiconductor 6 and an $n^+$ type semiconductor layer 8.

In the step of FIG. 10(b), source and drain electrodes 2 and 3 are formed on the $n^+$ type semiconductor layer 8 with a prescribed spacing.

Then, a resist film (not shown) is deposited over the entire surface and an aperture is formed in a center part of the resist film. Using the resist film as a mask, portions of the semiconductor layers 6 and 8 are etched away, forming a recess 10 with a prescribed depth as shown in FIG. 10(c).

Finally, a gate electrode 4 is formed in the recess 10, completing the FET shown in FIG. 10(d).

In the above-described LDD-FET of FIG. 7 and recessed gate FET of FIG. 9, since the surface concentration of the active layer 6 is low, a surface depletion layer is thick and adversely affected by surface states, resulting in undesirable gate pulse response delay during high frequency operation, an increase in the source resistance Rs, and channel concentration at the time of large signal input. These problems will be described in detail with respect to the recessed gate FET of FIG. 11.

In FIG. 11, a high density of surface states 20 at the surface of the GaAs channel layer 6 is positioned in the center of the GaAs forbidden band and capture and emits electrons repeatedly according to variations in the gate bias $V_{gs}$. The time constant of the electron emission is about several milliseconds and no electron emission follows electron capture in a high frequency band, such as a microwave band. However, since the time constant of the electron capture is significantly shorter than the time constant of the electron emission, a lot of captured electrons remain at the surface in the vicinity of the gate 4 during large amplitude operation when $V_{gs}$ is stationary is a high output device. Therefore, the surface depletion layer 21 in the vicinity of the gate 4 expands. If the channel layer 6 is blocked by the depletion layer 21 at the time of a transient or the like as shown in FIG. 11, the FET is unfavorably turned off. Even if the FET remains in the ON state, the depletion layer 21 causes channel concentration, i.e., the depletion layer narrows the channel between the GaAs surface and the substrate 1, resulting in poor linearity of input-output characteristics and low saturation output. Furthermore, in case of a single pulse input, so-called gate lag occurs.

FIG. 18 is a sectional view illustrating a conventional FET having a recessed gate structure. In the figure, reference numeral 21 designates a GaAs substrate. An n type active layer 22 is disposed on the GaAs substrate 1. An $n^+$ type active layer 23 is disposed on the n type active layer 22. A source electrode 27 and a drain electrode 26 are disposed on the $n^+$ type active layer 23 spaced apart from each other. A recess 30 is formed by etching away portions of the n type and $n^+$ type active layers 22 and 23. A T-shaped gate structure comprising a WSi lower gate electrode 28 and an Au upper gate electrode 29 is disposed on a part of the n type active layer 22 in the recess 30. The entire surface of the structure, except the source and drain electrodes 26 and 27, is covered with SiON films 41 and 42 which are formed by CVD.

Process steps for fabricating the FET of FIG. 18 are illustrated in FIGS. 19(a)–19(h). In the figures, the same reference numerals as in FIG. 18 designate the same parts. Reference numeral 31 designates a resist film, numeral 32 designates an $SiO_2$ film, and numeral 33 designates an SiO side wall.

Initially, ions are implanted into the GaAs substrate 21 to form the n type active layer 22 and the $n^+$ type active layer 23. Then, an $SiO_2$ film 32 and a resist film 31 are successively deposited on the semiconductor layer 23, and a recess pattern is formed in the resist film 31 (FIG. 19(a)).

Using the resist film 31 as a mask, a portion of the $SiO_2$ film 32 is etched away. Then, using the resist film 31 and the SiO₂ film 32 as a mask, portions of the semiconductor layers 23 and 22 are etched away to form a recess 30 having a prescribed depth (FIG. 19(b)).

After removing the resist film 31, an SiO₂ film 33 is deposited in the recess 30 and on the SiO₂ film 32 (FIG. 19(c)).

Then, the SiO₂ film 33 is selectively etched to form side walls 33a in the recess 30 (FIG. 19(d)).

A WSi film 28 and an Au film 29 are successively deposited on the bottom surface of the recess 30, on the side walls 33a, and on the SiO₂ film 32 (FIG. 19(e)).

A resist pattern 31 is formed on the Au film 29 opposite the recess 30, and the Au film 29 and the WSi film 28 are etched using the resist pattern 31 as a mask (FIG. 19(f)).

After removing the resist pattern 31, the SiO₂ side walls 33a and the SiO₂ film 32 are completely etched away (FIG. 19(g)).

To complete the FET, source and drain electrodes 26 and 27 are formed on the n⁺ type active layer 23 (FIG. 19(h)).

FIG. 20 is a sectional view of the recessed gate FET during large amplitude operation. In FIG. 20, reference numeral 35 designates a depletion layer in the OFF state of the FET, reference numeral 36 designates the depletion layer in the ON state, and numeral 37 designates the depletion layer in the transient state.

A description is given of the operation of this FET assuming that the source is grounded. When a negative voltage is applied to the gate of the FET, i.e., when the FET is in the ON state, the depletion layer extends from the gate electrode. When a positive voltage is applied to the gate, i.e., when the FET is in the OFF state, the depletion layer is reduced. Using this operation, the electric power input to the gate electrode (28 and 29) is amplified and drained from the drain electrode 27. During the high frequency and large amplitude operation, however, since electrons are captured by the surface states at the GaAs surface, the depletion layer opposite the gate electrode expands and the channel is narrowed.

In the above-described LDD-FET and recessed gate FETs, since the surface concentration of the active layer is low, the surface depletion layer is thick and adversely affected by the surface states, resulting in undesirable gate pulse response delay during high frequency operation, increase in the source resistance Rs, and channel concentration at the time of large signal input. Particularly during the high frequency and large amplitude operation, the channel concentration adversely affects the linearity of input-output characteristics and reduces the saturation power. Further, the gate lag, which occurs at the time of single pulse input, becomes considerable.

SUMMARY OF THE INVENTION

It is an object of the present invention to provide an FET that controls the thickness of the surface depletion layer to reduce the influence of the depletion layer on device characteristics, thereby suppressing the gate pulse response delay during high frequency operation, increase in source resistance Rs, and channel concentration at the time of large signal input.

It is another object of the present invention to provide a method for fabricating the FET.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a method for fabricating an FET of LDD (Lightly Doped Drain) structure, ions are implanted into an active layer at a low acceleration energy to a high concentration using a gate electrode or a dummy gate electrode formed on the active layer as a mask to form thin high carrier concentration regions at the surface of the active layer on the opposite sides of the gate or dummy gate electrode. In the FET thus fabricated, since a surface depletion layer is confined to the high carrier concentration thin regions at the surface of the active layer, influences of the depletion layer and surface states on device characteristics are reduced, whereby gate pulse response delay, increase in source resistance, and channel concentration at the time of large signal input are suppressed.

According to a second aspect of the present invention, in a method for fabricating an FET having a recessed gate, ions are implanted into an active layer at a low acceleration energy to a high concentration using, as a mask, a dummy gate electrode that is formed on the active layer in the recess, whereby thin high carrier concentration thin regions are formed at the surface of the active layer on the opposite sides of the gate electrode. In the FET thus fabricated, since a surface depletion layer is confined to the thin high carrier concentration regions at the surface of the active layer, influences of the depletion layer and surface states on device characteristics are reduced, whereby gate pulse response delay, increase in source resistance, and channel concentration at the time of large signal input are suppressed.

According to a third aspect of the present invention, in an FET having a recessed gate electrode, high carrier concentration regions are selectively disposed in an active layer in the vicinity of the gate electrode. Therefore, the shape of a surface depletion layer is controlled by the high carrier concentration regions, and influences of the depletion layer and surface states on device characteristics are reduced, whereby gate pulse delay is suppressed, the linearity of input-output characteristics is improved, and the saturation output power is increased.

According to a fourth aspect of the present invention, in a method for fabricating an FET having a recessed structure, a dummy gate formed on an active layer in a recess region is used for the formation of the recess structure, and ion implantation is carried out using the dummy gate and SiO₂ side walls of the recess as a mask to selectively form high carrier concentration regions in the vicinity of a gate electrode.

DETAILED DESCRIPTION OF THE PREFERRED EMBODIMENTS

Figure 1:
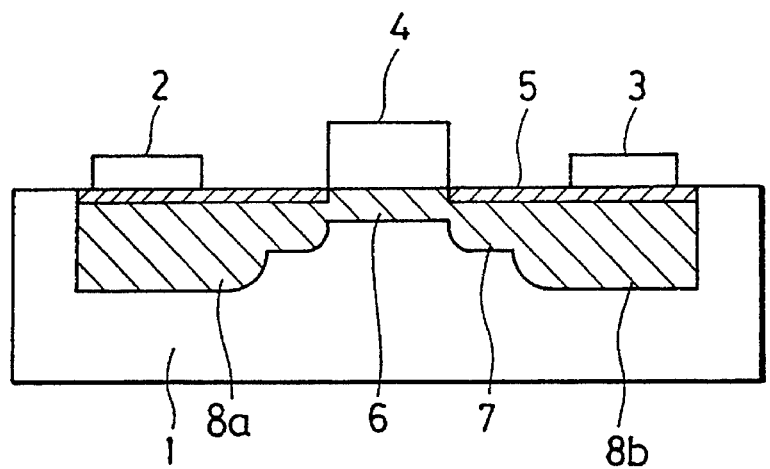
FIG. 1 is a sectional view illustrating an LDD-FET in accordance with a first embodiment of the present invention.

FIG. 1 is a sectional view illustrating an LDD-FET in accordance with a first embodiment of the present invention, In FIG. 1, reference numeral 1 designates a GaAs substrate, A gate electrode 4, a source electrode 2, and a drain electrode 3 are disposed on the GaAs substrate 1, An n type low carrier concentration GaAs region (hereinafter referred to as n type GaAs region) 6 serving as a channel region is disposed within the GaAs substrate 1 lying below the gate electrode 4, The depth of the n type GaAs region 6 from the surface of the substrate 1 is 1000–1500 Å, N type high carrier concentration GaAs regions (hereinafter referred to as $n^+$ type GaAs regions) 8a and 8b serving as source and drain regions are disposed within the GaAs substrate 1 lying below the source electrode 2 and the drain electrode 3, respectively, The depth of these $n^+$ type regions 8a and 8b from the surface is 4000–5000 Å, N type intermediate concentration GaAs regions (hereinafter referred to as n' type GaAs regions) 7 are disposed between the $n^+$ type GaAs source and drain regions 8a and 8b surrounding the n type GaAs region 6. The depth of these n' type GaAs regions 7 from the surface is 2000–2500 Å, N type very high carrier concentration GaAs regions (hereinafter referred to as $n^{++}$ type GaAs regions) 5 are disposed within the n' type regions 7 and the $n^+$ type regions 8a and 8b at opposite sides of the gate electrode 4 and reach the surface of the substrate 1. The depth of these $n^{++}$ type GaAs regions 5 from the surface is 300–500 Å.

FIGS. 2(a)–2(d) are sectional views illustrating a method for fabricating the FET of FIG. 1. In the figures, reference numeral 9 designates an SION film.

Figure 2A:
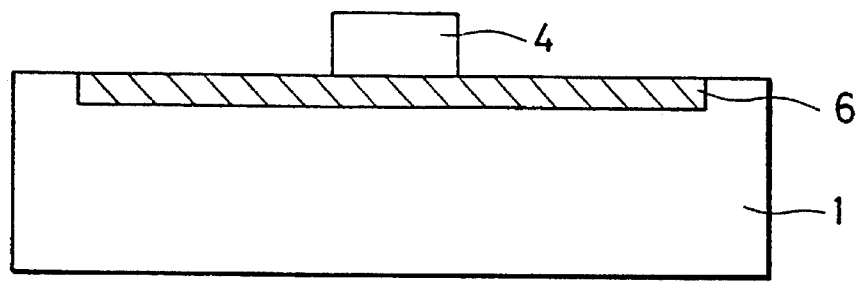
FIGS. 2(a)–2(d) are sectional views illustrating process steps in a method for fabricating the LDD-FET of FIG. 1.

Initially, as illustrated in FIG. 2(a), Si ions are selectively implanted into the semiconductor substrate 1 at an acceleration energy of 40 KeV to form an n type region 6 having a carrier concentration of $1\sim5\times10^{17}$ cm$^{-3}$ and a depth of 1000–1500 Å. Then, a refractory metal, such as WSi, is deposited on the n type semiconductor region 6 and patterned to form a gate electrode 4. Preferably, the gate length is 0.35–1.0 μm.

Figure 2B:
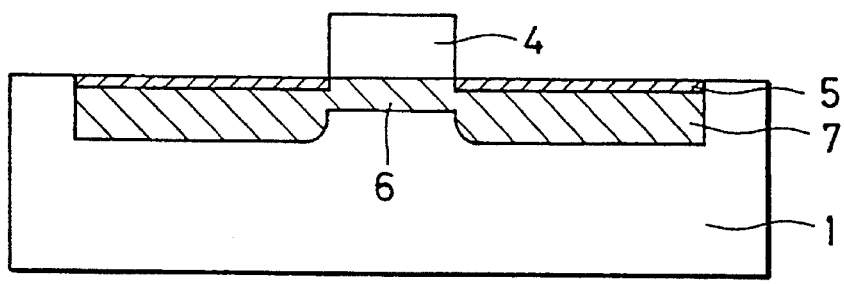

In the step of FIG. 2(b), using the gate electrode 4 as a mask, Si ions are implanted at an acceleration energy of 60–80 KeV to form n' type regions 7 having a carrier concentration of $3\sim8\times10^{17}$ cm$^{-3}$ and a depth of 2000–3000 Å and, subsequently, Si ions are implanted at a low acceleration energy of 10–30 KeV to form $n^{++}$ type regions 5 having a carrier concentration of $8\sim15\times10^{17}$ cm$^{-3}$ and a depth of 300–500 Å.

Figure 2C:
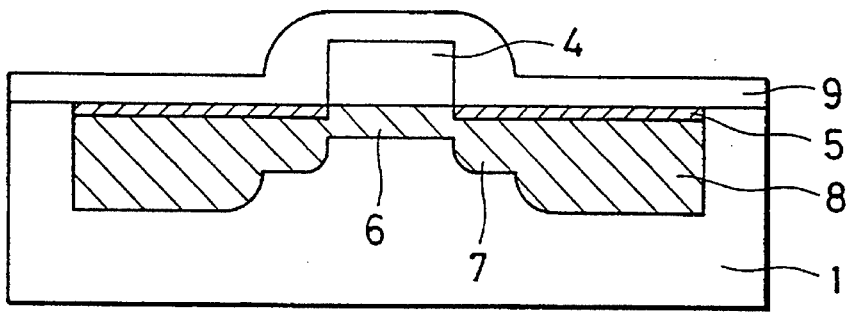

Then, an SiON film 9 is deposited over the entire surface as shown in FIG. 2(c), and Si ions are implanted through the SiON film 9 at an acceleration energy of 150–170 KeV to form $n^+$ type regions 8 having a carrier concentration of $8\sim12\times10^{17}$ cm$^{-3}$ and a depth of 4000–5000 Å.

Figure 2D:
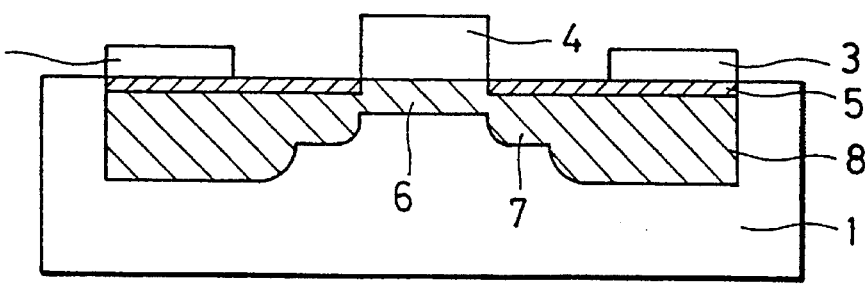

After removing the SiON film 9, the substrate is annealed at 800°–900° C. for 5–30 minutes. Then, source and drain electrodes 2 and 3 comprising Ni/AuGe are formed on the $n^{++}$ type regions 5 spaced apart from each other, completing the FET as shown in FIG. 2(d). Although the carrier concentration of the $n^{++}$ type region 5 is higher than that of the $n^+$ type region 8, the $n^{++}$ type region 5 may be of the same carrier concentration as the $n^+$ type region 8. In this case, the $n^{++}$ type regions 5 are present only on the n' type regions 7.

According to the first embodiment of the present invention, since the $n^{++}$ type very high carrier concentration regions 5 are present at the surface of the n' type and $n^+$ type regions 7 and 8, a depletion layer created into the vicinity of the gate electrode extends in the $n^{++}$ type high carrier concentration regions 5, i.e., the extension of the depletion layer is restricted to the $n^{++}$ regions 5. Therefore, the channel region is not narrowed due to the depletion layer, whereby the linearity of input-output characteristics during large amplitude operation is improved and the gate lag is avoided.

Figure 11:
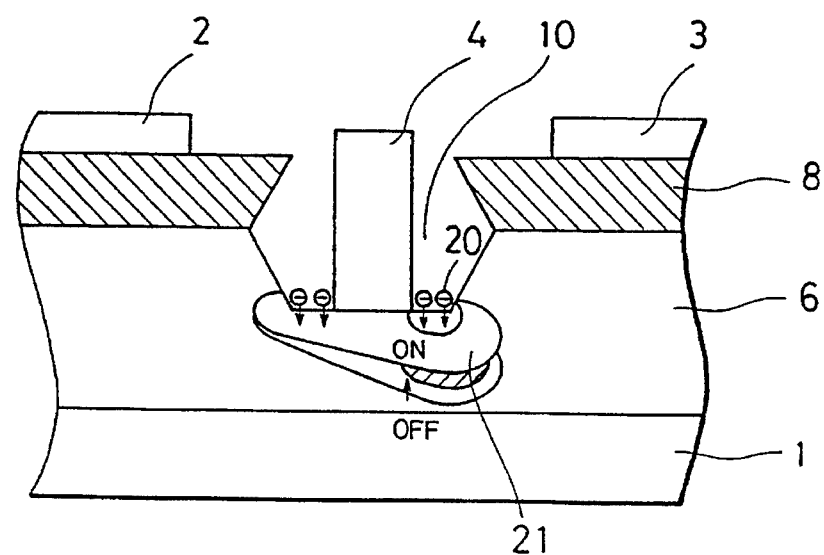
FIG. 11 is a sectional view for explaining problems in the conventional recessed gate FET of FIG. 9.
Figure 8A:
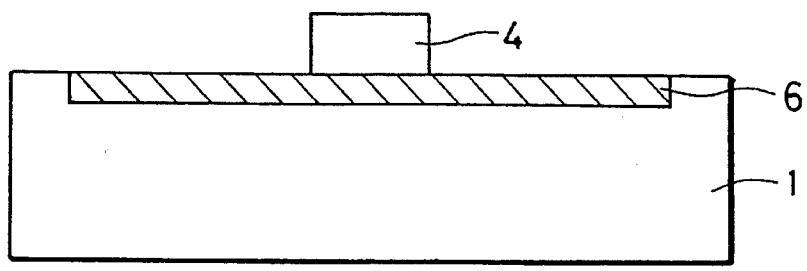
FIG. 8(a)–8(d) are sectional views illustrating process steps in a method for fabricating the LDD-FET of FIG. 7.
Figure 8B:
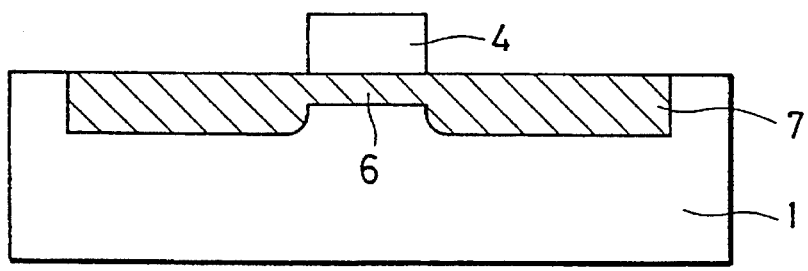
Figure 8C:
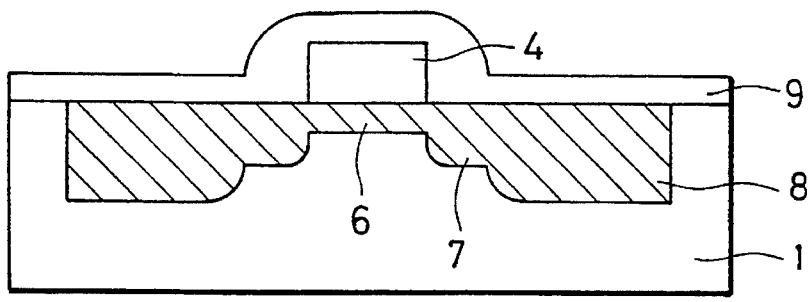
Figure 8D:
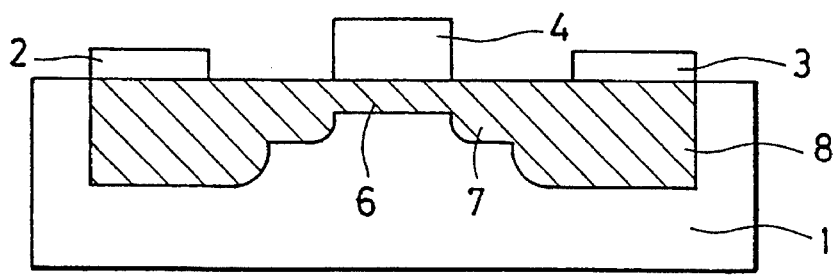
Figure 10A:
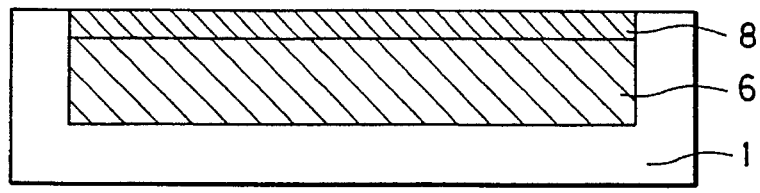
FIGS. 10(a)–10(d) are cross-sectional views illustrating a method for producing the FET of FIG. 9.
Figure 10B:
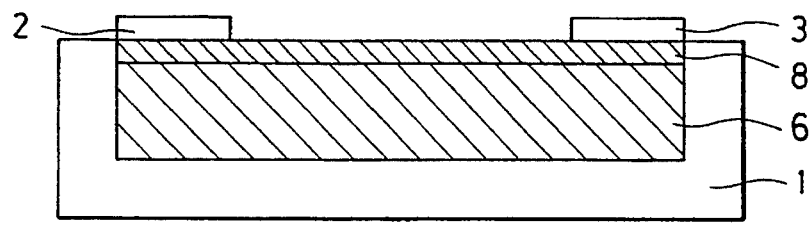
Figure 10C:
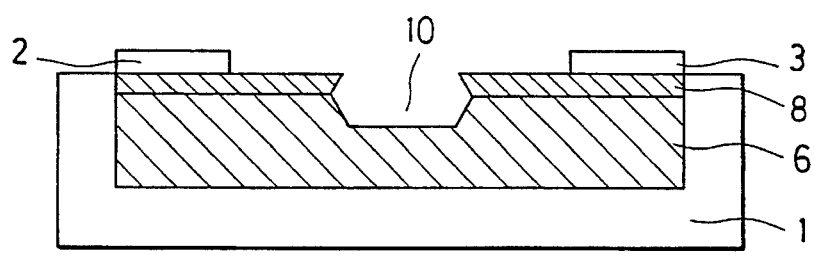
Figure 10D:
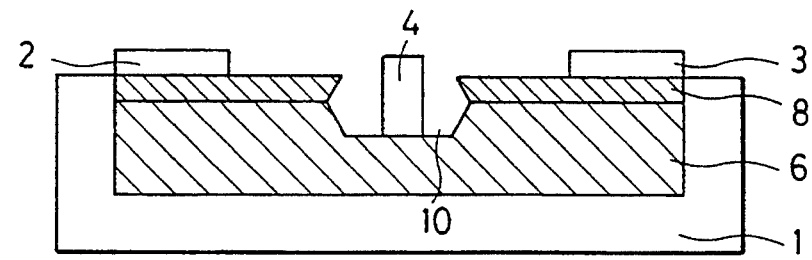

Meanwhile, Japanese Published Patent Application No. 2222549 discloses a GaAs FET including gate, source, and drain electrodes disposed on a surface of an active layer, in which a high resistance region is formed in the active layer by implanting ions that can increase the resistance of the active layer from the surface and a passivation film is formed on the high resistance region, whereby the thickness of the surface depletion layer which affects the series resistance of the active layer is determined by the high resistance region and the active layer. In this structure, since the thickness of the surface depletion layer is fixed regardless of the quality of the passivation film, the series resistances between the source and gate electrodes and between the gate and drain electrodes are constant, resulting in stable electrical characteristics of the FET. In order to achieve large amplitude operation of this FET, a positive bias should be applied to the gate electrode to reduce the depletion layer. In this FET, however, since the high resistance region is present around the gate, the depletion region is large and fixed, i.e., it does not diminish, so that the operation of the FET is adversely affected by surface states as described with respect to FIG. 11.

In the FET according to the first embodiment of the present invention, contrary to making the thickness of the surface depletion layer fixed using the high resistance layer, the extension of the surface depletion layer is restricted to the $n^{++}$ type very high carrier concentration regions 5 at the surface of the active regions 7 and 8, whereby the thickness of the surface depletion layer is controlled. Therefore, large amplitude operation of the FET is possible, and the gate pulse response delay during high frequency operation, the increase in source resistance Rs, and the channel concentration at the time of large signal input are reliably controlled.

While in the above-described first embodiment the $n^{++}$ very high carrier concentration regions 5 are formed using the gate electrode 4 as a mask, these regions 5 may be formed using a dummy gate, which is replaced with a gate electrode after the formation of the $n^{++}$ regions 5, as a mask.

Figure 3:
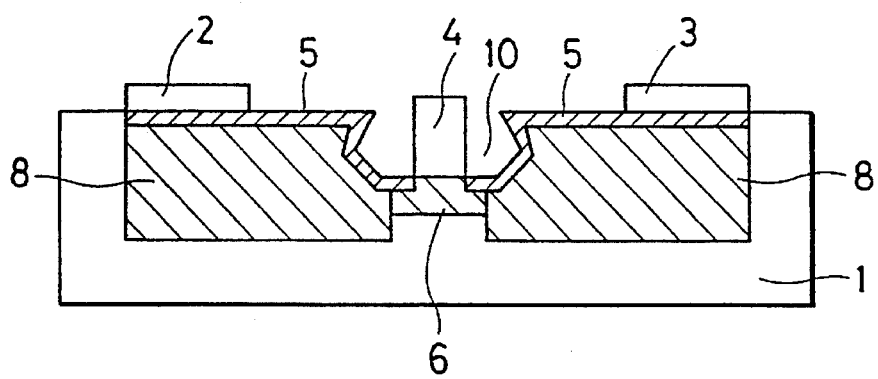
FIG. 3 is a sectional view illustrating a recessed gate FET in accordance with a second embodiment of the present invention.

FIG. 3 is a cross-sectional view illustrating a recessed gate FET in accordance with a second embodiment of the present invention. In FIG. 3, reference numeral 1 designates a semi-insulating GaAs substrate. The GaAs substrate 1 has a recess 10 about 1800 Å deep from the surface. An n type low carrier concentration GaAs region 6 serving as a channel is disposed in the GaAs substrate 1 opposite the recess 10. The depth of the n type GaAs region 6 from the bottom of the recess 10 is 1000~1500 Å. $N^+$ type high carrier concentration GaAs regions 8 serving as source and drain regions are disposed in the GaAs substrate 1 at opposite sides of and in contact with the n type GaAs channel region 6. The depth of the $n^+$ type GaAs regions 8 from the surface of the substrate 1 is 4000~5000 Å. A gate electrode 4 is disposed in the recess 10 contacting the n type GaAs region 6. $N^{++}$ type very high carrier concentration GaAs regions 5 are disposed at the surface of the $n^+$ type GaAs regions 8 and the n type GaAs region 6 except for a part beneath the gate electrode 4. Source and drain electrodes 2 and 3 are disposed on the $n^{++}$ type GaAs regions 5 spaced apart from each other.

A method for fabricating the FET of FIG. 4 is illustrated in FIGS. 4(a)–4(e). In the figures, reference numeral 11 designates an SiO film, numeral 12 designates a resist film, and numeral 13 designates an SiO dummy gate.

Figure 4A:
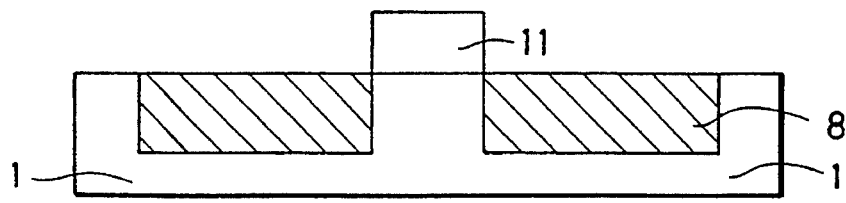
FIGS. 4(a)–4(e) are cross-sectional views illustrating process steps in a method for fabricating the FET of FIG. 3.

Initially, as illustrated in FIG. 4(a), an SiO film pattern 11 is formed on a part of the semiconductor substrate 1 where a gate recess is to be formed. Using the SiO pattern 11 as a mask, Si ions are implanted into the substrate 1 at an acceleration energy of 150~170 KeV to form the $n^+$ type GaAs regions 8a having a carrier concentration of 2.5~3.0× $10^{17}$ cm$^{-3}$ and a depth of 4000~5000 Å from the surface.

Figure 4B:
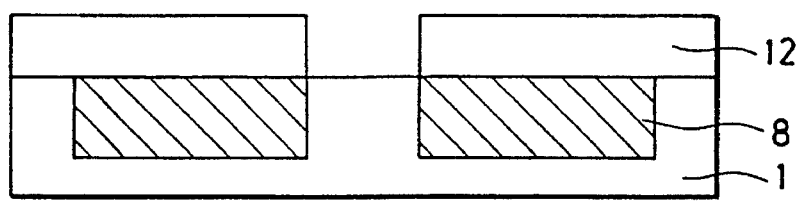

In the step of FIG. 4(b), a resist film is deposited over the entire surface and etched back to expose the SiO film 11 and, thereafter, the SiO film 11 is removed in a wet etching process using hydrogen peroxide sulfate as an etchant, leaving a resist pattern 12.

Figure 4C:
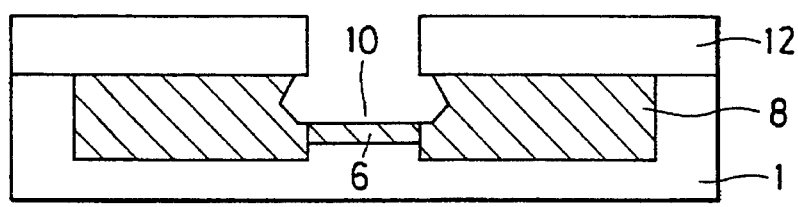
Figure 4D:
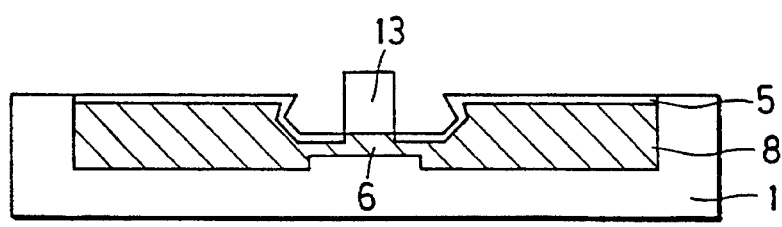

In the step of FIG. 4(c), using the resist pattern 12 as a mask, the semiconductor substrate 1 is etched with the etchant of hydrogen peroxide sulfate to form the recess 10 having a width of 0.7~1.5 μm and a depth of about 1800 Å. As shown in FIG. 4(c), the side surface of the recess 10 includes two planes oriented in different directions. Thus, a desired shape of the recess is achieved by appropriately controlling the composition ratio of the etchant. Thereafter, using the resist pattern 12 as a mask, Si ions are implanted into the substrate 1 at an acceleration energy of 40 KeV to form the n type GaAs region 6 having a carrier concentration of 1.0~2.0 ×$10^7$ cm$^{-3}$ and a depth of 1000~1500 Å.

Then, an SiO dummy gate 13 is formed on a part of the active region 6 exposed in the recess 10 by a lift-off technique using an SiO film. Using this SiO dummy gate 13 as a mask, Si ions are implanted at a low acceleration energy of 15~30 KeV to form the $n^{++}$ type regions 5 at the internal surface of the recess 10 and the upper surface of the $n^+$ type regions 8, which $n^{++}$ type regions 5 have a relatively high carrier concentration of 8~15×$10^{17}$ cm$^{-3}$ and a depth of 300~500 Å from the surface (FIG. 4(d)).

The substrate is annealed at 800°~900° C. for 5~30 minutes to activate the implanted ions. Then, a resist film (not shown) is deposited over the substrate and softened by heat so that the SiO dummy gate 13 is completely covered with the resist film, followed by removal of the SiO dummy gate 13, forming an aperture in the resist film. Then, a metal layer comprising Ti/Mo/Au is deposited in the aperture of the resist film, and the resist film and overlying portions of the metal layer are removed by a lift-off technique, forming the gate electrode 4.

Figure 4E:
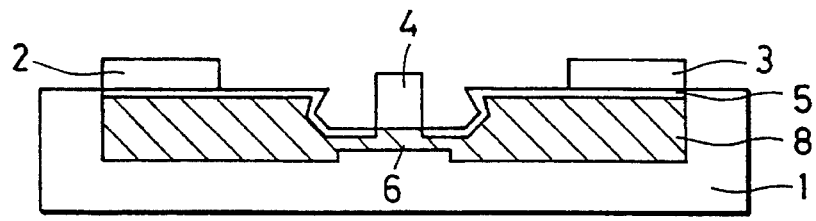

Then, source and drain electrodes 2 and 3 comprising Ni/AuGe are formed on the $n^{++}$ type GaAs regions 5 with a prescribed spacing, completing the FET of FIG. 4(e).

In the FET according to the second embodiment of the present invention, since the very high concentration $n^{++}$ regions 5 are present at the internal surface of the recess 10, except beneath the gate electrode, and at the surface of the $n^+$ type GaAs regions 8, the extension of the surface depletion layer in the vicinity of the gate electrode 4 is controlled, i.e., the extension of the surface depletion layer is restricted to the $n^{++}$ type regions 5. Therefore, the channel region is not narrowed by the depletion layer, and the linearity of input-output characteristics during large amplitude operation is improved and the gate lag is avoided. As a result, the gate pulse response delay during an high frequency operation, an increase in source resistance Rs, and the channel concentration at the time of large signal input are effectively suppressed. In addition, the FET with the gate recess of this second embodiment has higher resistance to high voltage and higher power than the LDD-FET of the first embodiment.

Figure 5:
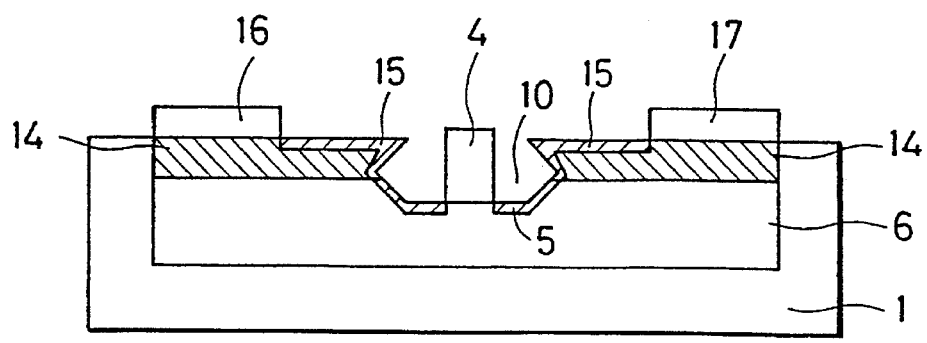
FIG. 5 is a cross-sectional view illustrating a recessed gate FET in accordance with a third embodiment of the present invention.

FIG. 5 is a cross-sectional view illustrating a recessed gate FET in accordance with a third embodiment of the present invention. In FIG. 5, an n type GaAs low carrier concentration GaAs region 6 is disposed within a semi-insulating GaAs substrate 1. An $n^+$ type high carrier concentration InGaAs region 14 is disposed on the n type low carrier concentration GaAs region 6. Source and drain electrodes 16 and 17 comprising WSi are disposed on portions of the InGaAs region 14 spaced apart from each other. A recess 10 penetrates through portions of the GaAs region 6 and the InGaAs region 14. A gate electrode 4 is disposed on a part of the n type GaAs region 6 exposed in the recess 10. $N^{++}$ type very high carrier concentration GaAs regions 5 are disposed at the surface of the n type GaAs region 6 in the recess 10 except a part on which the gate electrode 4 is present. $N^{++}$ type very high carrier concentration InGaAs regions 15 are disposed at the surface of the $n^+$ type InGaAs region 14 except portions where the source and drain electrodes 16 and 17 are present.

A method for producing the FET of FIG. 5 is illustrated in FIGS. 6(a)–6(d).

Figure 6A:
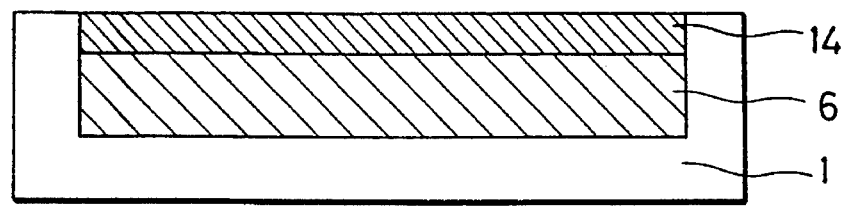
FIGS. 6(a)–6(d) are sectional views illustrating process steps in a method for fabricating the FET of FIG. 5.

Initially, as illustrated in FIG. 6(a), the $n^+$ type InGaAs region 14 having a carrier concentration of 8~15×$10^{17}$ cm$^{-3}$ is formed on the n type GaAs region 6 having a carrier concentration of 1~5×$10^{17}$ cm$^{-3}$. Portions of the semi-insulating GaAs substrate 1 other than these active regions 6 and 14 are insulated using mesa separation and isolation.

Figure 6B:
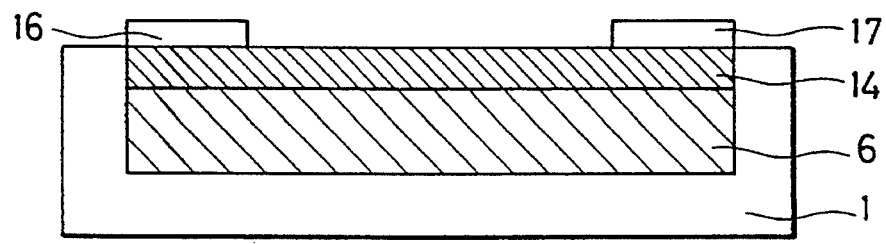
Figure 6C:
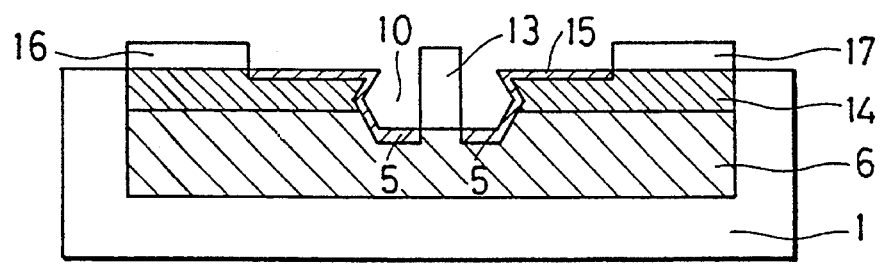
Figure 6D:
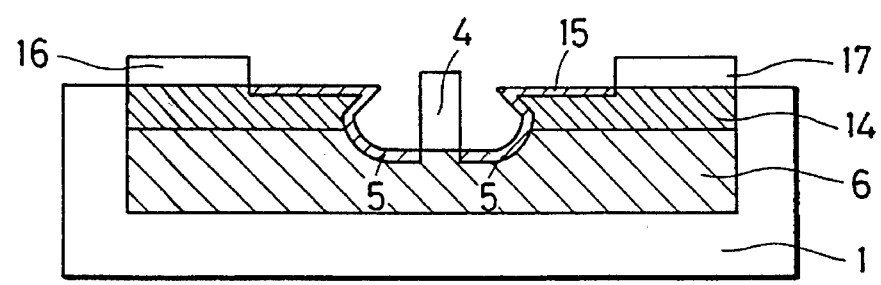
Figure 7:
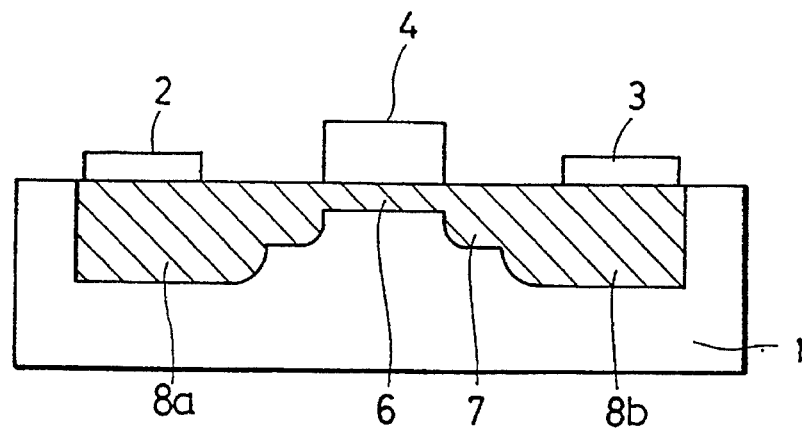
FIG. 7 is a sectional view illustrating a conventional LDD-FET.
Figure 9:
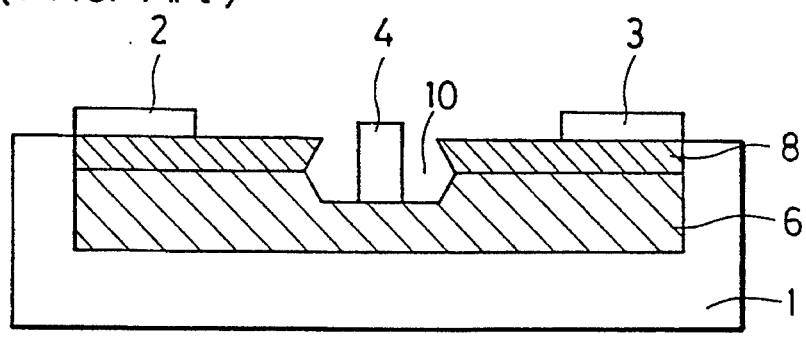
FIG. 9 is a sectional view illustrating a conventional recessed gate FET.

In the step of FIG. 6(b), WSi is deposited on the $n^+$ type InGaAs region 14 and patterned to form spaced apart source and drain electrodes 16 and 17. The WSi source and drain electrodes 16 and 17 make ohmic contacts with the $n^+$ type InGaAs region 14.

Then, a resist film (not shown) is deposited on the n⁺ type InGaAs region 14 and on the source and drain electrodes 16 and 17, and an aperture pattern is formed in the center of the resist film. Using the resist film as a mask, portions of the semiconductor regions 14 and 6 are etched away with the same etchant as used in the second embodiment, forming a recess 10 of a desired depth which depends on the etching time (FIG. 6(c)). Preferably, the depth of the recess 10 is about 1800 Å.

Then, an SiO dummy gate 13 is formed on a part of the active region 6 in the recess 10. Using the dummy gate 13 and the source and drain electrodes 16 and 17 as masks, Si ions are implanted from the surface at a low acceleration energy of 15~30 KeV, forming the $n^{++}$ type InGaAs regions 15 and the $n^{++}$type GaAs regions 5 having a high carrier concentration of $8~15\times10^{17}$ cm$^{-3}$ (FIG. 6(c)). However, the highest possible carrier concentration of these $n^{++}$ type regions is $60\times10^{17}$ cm$^{-3}$. Preferably, these $n^{++}$ type regions are 300~500 Å thick. Although these $n^{++}$ type regions 5 and 15 have to be formed over the internal surface of the recess 10 except for the part beneath the dummy gate 13, the $n^{++}$ type regions 15 at the upper surface of the n⁺ type InGaAs layer 14 may be shorter than shown in FIG. 5 if only formed in the vicinity of the opposite edges of the recess 10.

Then, the substrate is annealed at 800°~900° C. for 5~30 minutes to activate the implanted ions. Then, a resist film (not shown) is deposited over the substrate and softened by heat so that the dummy gate 13 is completely covered with the resist film, followed by removal of the dummy gate 13, forming an aperture in the resist film. Then, a metal layer comprising Ti/Mo/Au is deposited on the resist film to fill the aperture of the resist film. Then, the resist film and overlying portions of the metal layer are removed by a lift-off technique, leaving the gate electrode 4 (FIG. 6(d)).

Figure 12:
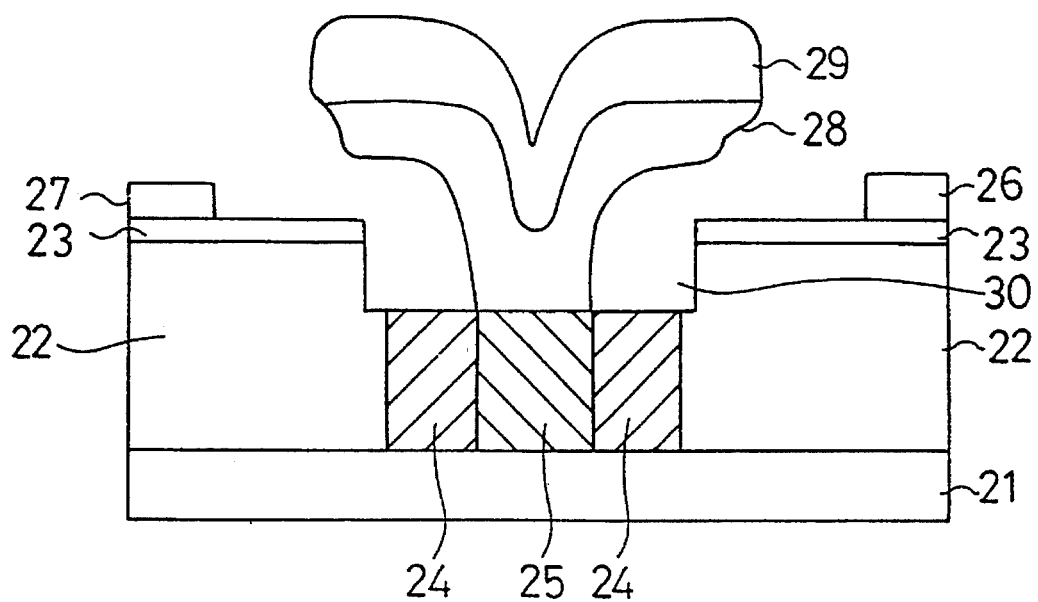
FIG. 12 is a sectional view illustrating a recessed gate FET in accordance with a fourth embodiment of the present invention.

According to the third embodiment of the present invention, as in the above-described first and second embodiments, the $n^{++}$ type very high concentration regions 15 and 5 control the extension of the surface depletion layer in the vicinity of the gate electrode. Therefore, the channel is not narrowed by the depletion layer, whereby the linearity of input-output characteristics during large amplitude operation is improved and gate lag is avoided. In addition, since the n⁺ InGaAs layer 14 is present on the n type GaAs layer 6, WSi, which does not make ohmic contact with GaAs but makes ohmic contact with InGaAs, can be employed as the material of the source and drain electrodes FIG. 12 is a sectional view illustrating an FET having a high carrier concentration region in the vicinity of a gate electrode, in accordance with a fourth embodiment of the present invention. In the figure, reference numeral 21 designates a GaAs substrate having a recess 30. N type active regions 22 are disposed within the GaAs substrate 21 spaced apart from each other. N⁺ type active regions 23 are disposed on the n type active regions 22. A gate electrode comprising a lower WSi layer 28 and an upper Au layer 29 is disposed in the recess 30. A source electrode 27 and a drain electrode 26 are disposed on the n⁺ type active regions 23 spaced apart from each other. An n type active region 25 is disposed in the GaAs substrate 1 opposite the gate electrode. N' type active regions 24 are disposed at opposite sides and in contact with the n type active region 25.

A method for fabricating the FET of FIG. 12 is illustrated in FIGS. 13(a)–13(f). In the figures, reference numeral 31 designates a resist film, numeral 32 designates an SiO₂ film, numeral 33 designates an SiO₂ dummy gate, and numeral 34 designates SiO₂ side walls. The above described active regions 22 to 25 are formed by ion implantation, and energies and doses of implanted ions are shown in the following Table 1. Thicknesses and carrier concentrations of the respective regions are shown in the following Table 2.

In addition, the annealing of the substrate after the ion implantation is carried out at 800°~850° C. for 15~45 minutes.

TABLE 1

|  | implantation energy | dose |
|---|---|---|
| n region 22 | 150 ~ 170 KeV | $1.0 ~ 1.5 \times 10^{13}$cm$^{-2}$ |
| n⁺ region 23 | 30 ~ 50 KeV | $6 ~ 8 \times 10^{12}$cm$^{-2}$ |
| n' region 24 | 40 ~ 60 KeV | $5 ~ 10 \times 10^{12}$cm$^{-2}$ |
| n region 25 | 30 ~ 60 KeV | $4 ~ 8 \times 10^{12}$cm$^{-2}$ |

TABLE 2

|  | thickness | carrier concentration |
|---|---|---|
| n region 22 | 3000 ~ 3500 Å | $2.0 ~ 2.5 \times 10^{17}$cm$^{-3}$ |
| n⁺ region 23 | 500 ~ 800 Å | $5 ~ 8 \times 10^{17}$cm$^{-3}$ |
| n' region 24 | 600 ~ 1000 Å | $3 ~ 8 \times 10^{17}$cm$^{-3}$ |
| n region 25 | 500 ~ 1000 Å | $2 ~ 7 \times 10^{17}$cm$^{-3}$ |

A description is given of the production process.

Figure 13:
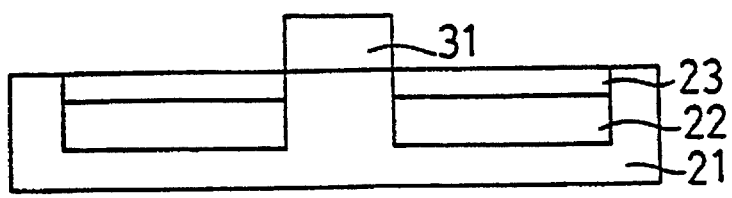
FIGS. 13(a)–13(f) are sectional views illustrating process steps in a method for fabricating the FET of FIG. 12.
Figure 13:
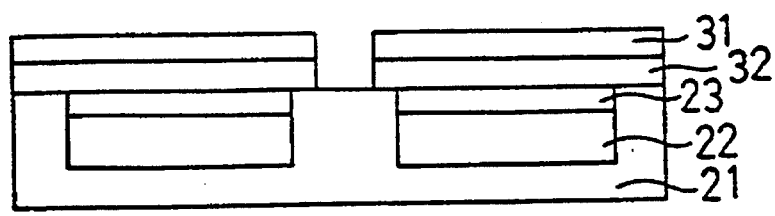
Figure 13:
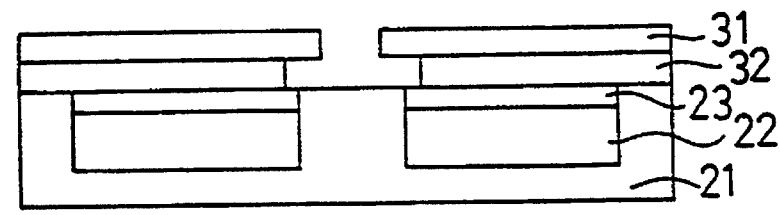
Figure 13:
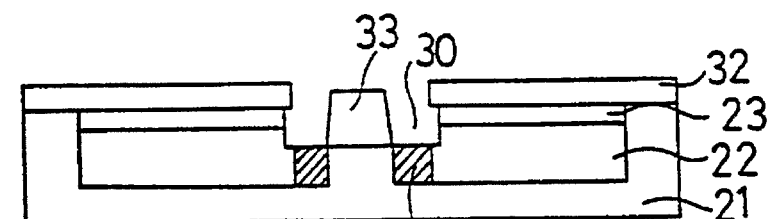
Figure 13:
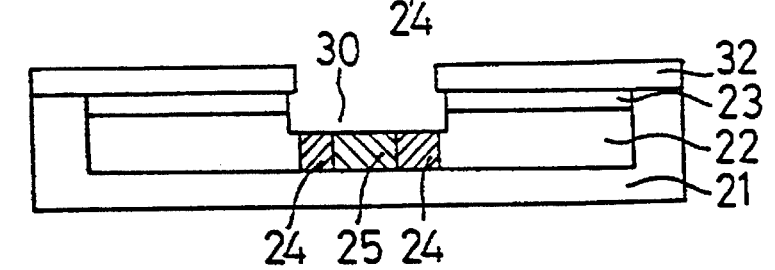
Figure 13:
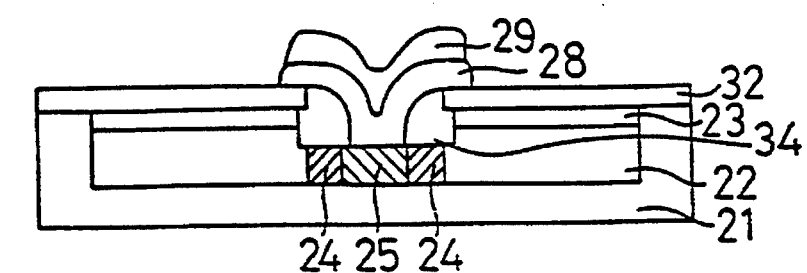

Initially, a resist film 31 is formed on a part of the GaAs substrate 21 and ions are implanted into the substrate 21 using the resist film 31 as a mask, forming the n type active regions 22 and the n⁺ type active regions 23 (FIG. 13(a)).

An SiO₂ film 32 and a resist film 31 are successively deposited over the surface, and an aperture pattern is formed in the resist film 31, followed by etching of the SiO₂ film 32 using the resist film 31 as a mask (FIG. 13(b)).

Then, side portions of the SiO₂ film 32 exposed in the aperture are etched away (FIG. 13(c)), Using the SiO₂ film as a mask, a portion of the substrate is etched away to form a recess 30. Then, an SiO₂ dummy gate 33 is formed using a conventional lift-off technique (FIG. 13(d)).

Using the SiO₂ dummy gate 33 and the SiO₂ film 32 as a mask, ions are implanted to form the n' type active regions 24 in the (FIG. 13(d)).

After removing the SiO₂ dummy gate 33, the n type active region 25 is formed by ion implantation (FIG. 13(e)).

An SiO₂ film is deposited over the surface and selectively etched to form side walls 34. Then, a WSi film 28 and an Au film 29 are successively deposited on the side walls 34 to completely fill the recess 30, and a prescribed resist pattern (not shown) is formed on the Au film opposite the recess 30. Using the resist pattern as a mask, the WSi film 28 and the Au film 29 are etched (FIG. 13(f)).

Finally, the SiO₂ film 32 is etched away and source and drain electrodes 27 and 26 are formed on the n⁺ type active regions 23, resulting in the FET of FIG. 12.

Figure 14:
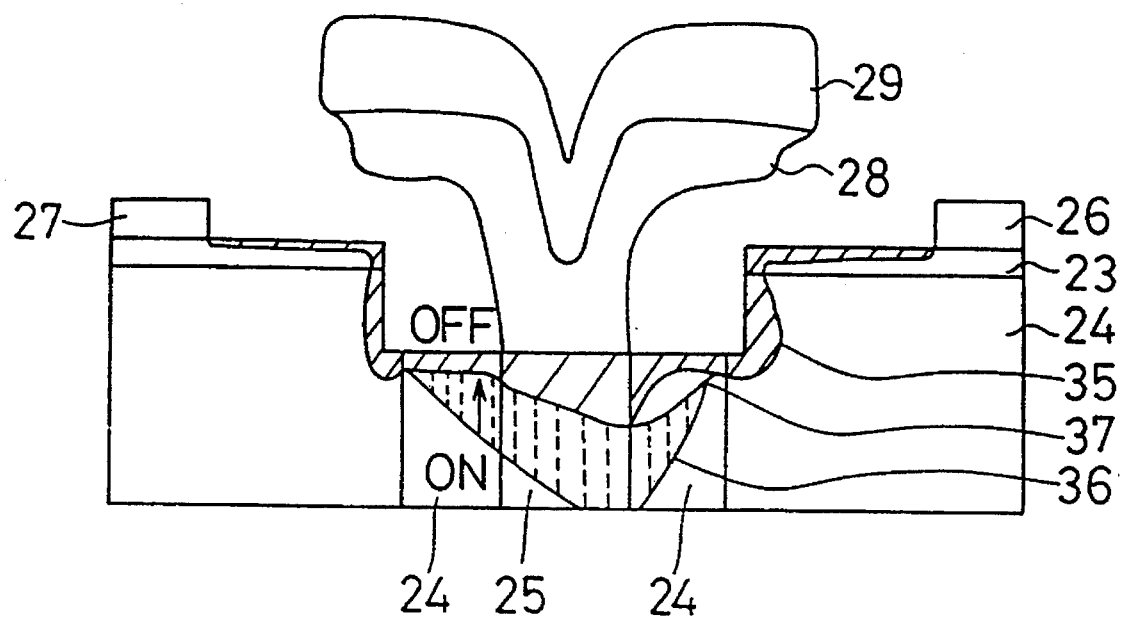
FIG. 14 is a sectional view illustrating the recessed gate FET of FIG. 12 during large amplitude operation.

FIG. 14 is a sectional view illustrating this FET during the operation, in which reference numeral 35 designates a depletion layer in the OFF state, numeral 36 designates the depletion layer in the ON state, and numeral 37 designates the depletion layer in the transient state.

In the recessed gate FET according to the fourth embodiment of the present invention, since the n' type high carrier concentration regions 24 disposed in the vicinity of the gate electrode reduce the surface depletion layer, the extension of the depletion layer due to surface states during high frequency and large amplitude operation is suppressed, whereby channel concentration is suppressed.

Figure 15:
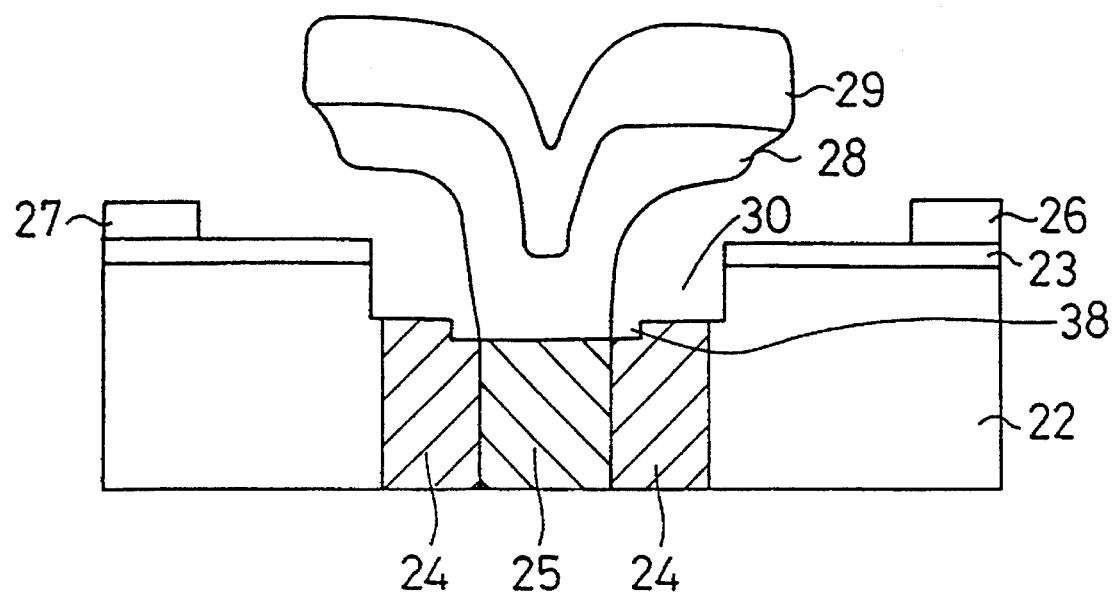
FIG. 15 is a sectional view illustrating an FET of two-stage recess structure in accordance with a fifth embodiment of the present invention.

FIG. 15 is a sectional view illustrating a two-stage recess FET having a high carrier concentration region in the vicinity of a gate electrode, in accordance with a fifth embodiment of the present invention. In the figure, the two-stage recess structure comprises an upper recess 30 and a lower recess 38.

A method for fabricating this FET is schematically illustrated in FIGS. 16(a)–16(g).

The steps illustrated in FIGS. 16(a)–16(d) are identical to those already described with respect to FIGS. 13(a)–13(d) and, therefore, do not require repeated description.

Figure 16:
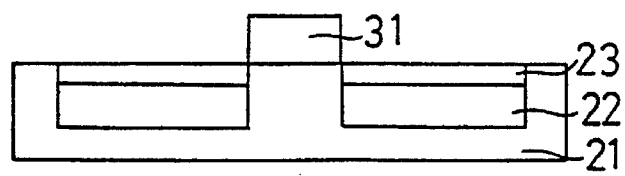
FIGS. 16(a)–16(g) are sectional views illustrating process steps in a method for fabricating the FET of FIG. 15.
Figure 16:
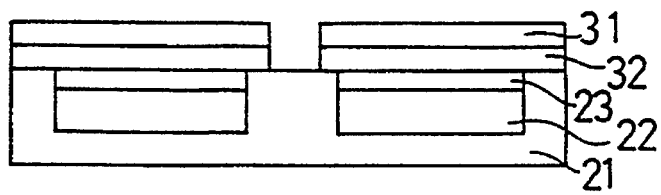
Figure 16:
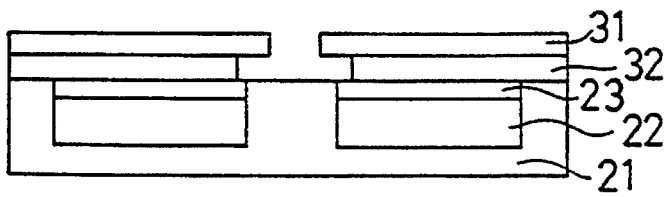
Figure 16:
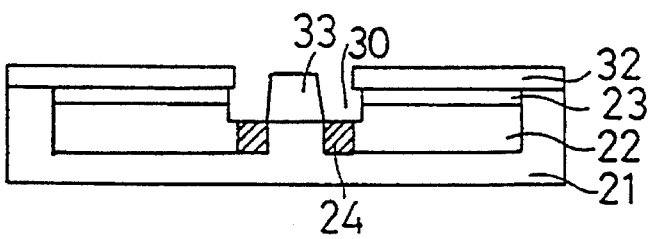
Figure 16:
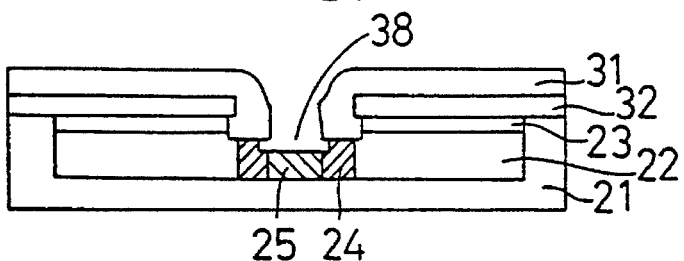
Figure 16:
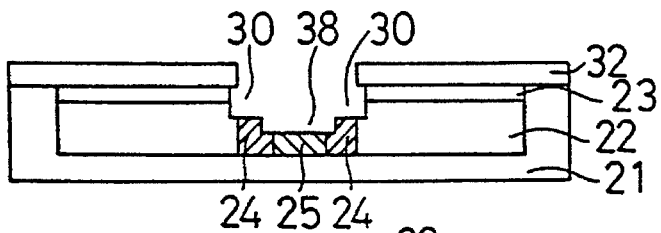
Figure 16:
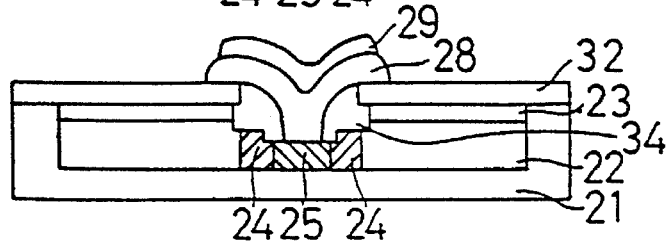

In the step of FIG. 16(e), a resist film 31 is deposited over the surface so that spaces at opposite sides of the dummy gate 33, i.e., the upper recess 30, are completely filled with the resist film. Then, the SiO₂ dummy gate 33 is removed, and the lower recess 38 is formed by etching (FIG. 16(e)).

After removing the resist film 31, the depths of the lower recess 38 and the upper recess 30 are increased by etching, resulting in the two-stage recess structure. Thereafter, using the insulating film 31 as a mask, ions are lightly implanted to form the n type active region 5 whose carrier concentration is lower than that of the n' active regions 24 but a little higher than that of the n type active region 22 (FIG. 16(f)).

Then, an SiO₂ film is deposited and etched to form SiO₂ side walls 34 on opposite side surfaces of the recess structure. Then, a WSi film 28 and an Au film 29 are successively deposited on the bottom surface of the recess structure and on the side walls 34, and a resist pattern is formed on the Au film 29 opposite the recess structure. Using the resist pattern as a mask, the Au film 29 and the WSi film 28 are etched to form a gate electrode (FIG. 16(g)). Thereafter, the SiO₂ film 32 and the SiO₂ side walls 34 are completely etched away.

To complete the FET of FIG. 15, a source electrode 27 and a drain electrode 26 are formed on the n⁺ type active regions 23.

Figure 17:
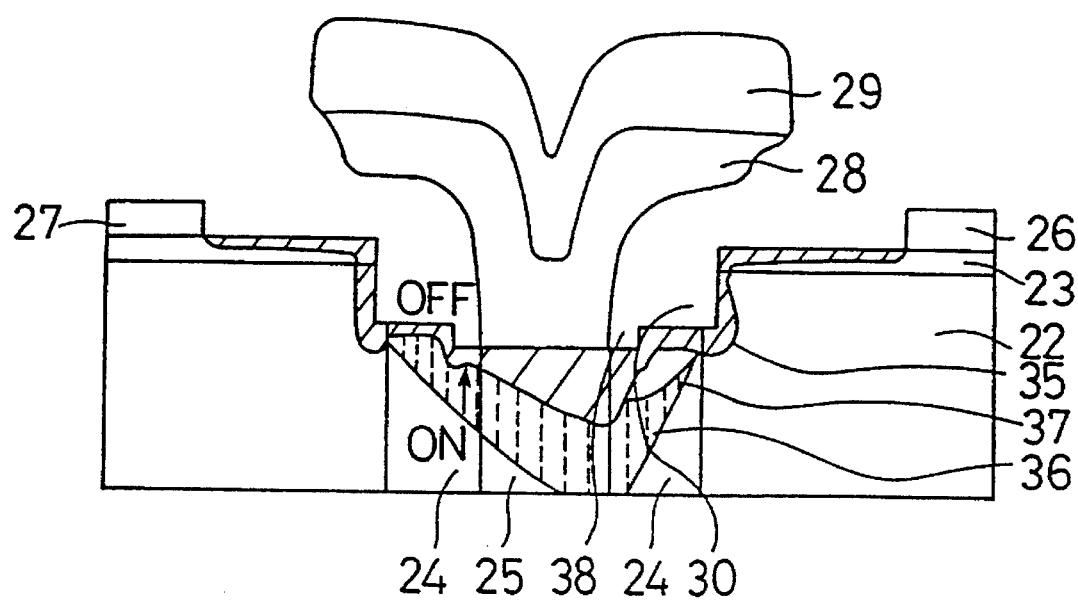
FIG. 17 is a sectional view illustrating the FET of FIG. 15 during large amplitude operation.
Figure 18:
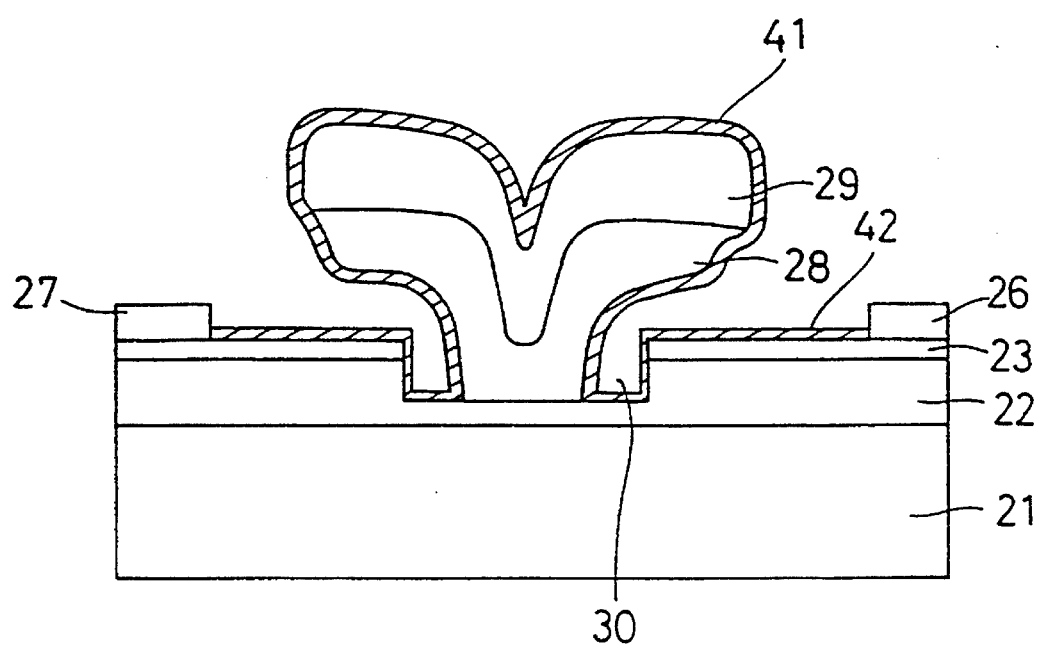
FIG. 18 is a sectional views illustrating a conventional recessed gate FET.
Figure 19:
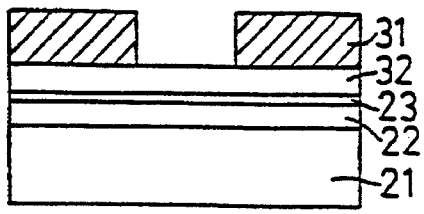
FIGS. 19(a)–19(h) are sectional views illustrating process steps in a method for fabricating the FET of FIG. 18.
Figure 19:
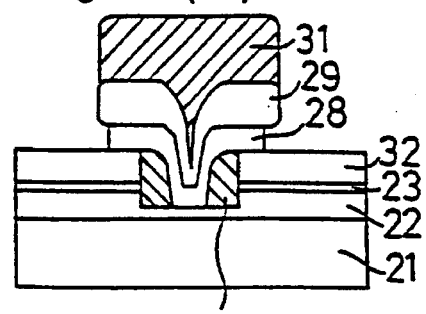
Figure 19:
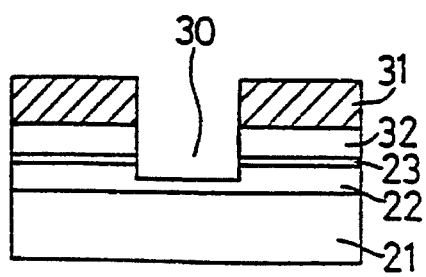
Figure 19:
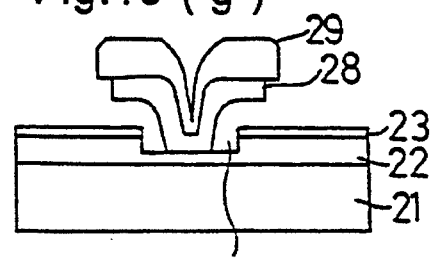
Figure 19:
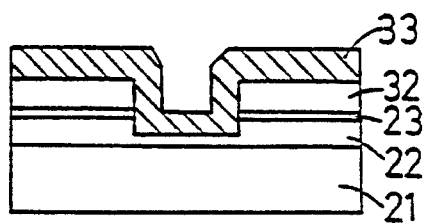
Figure 19:
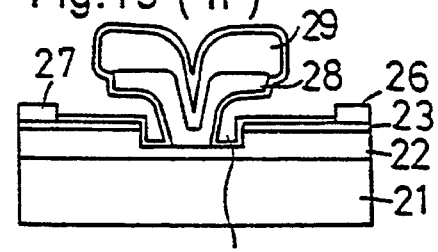
Figure 19:
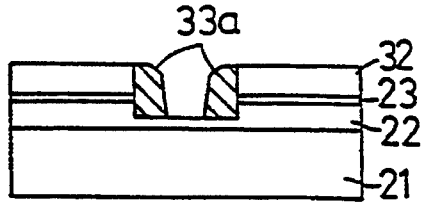
Figure 19:
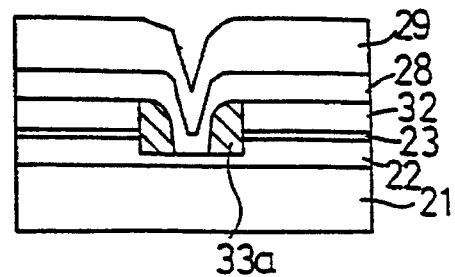
Figure 20:
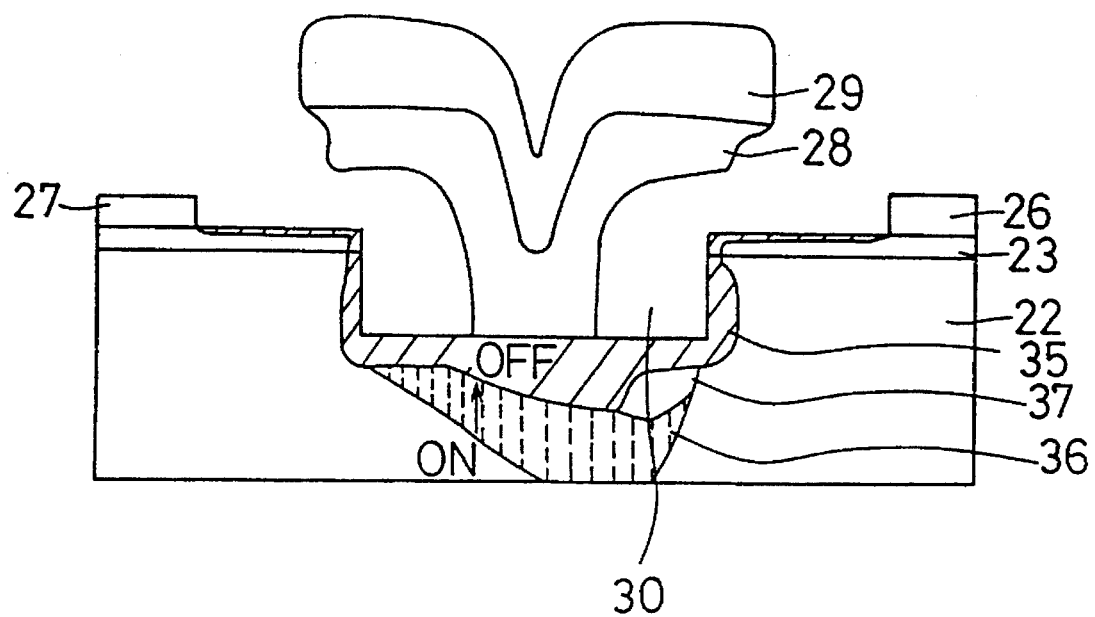
FIG. 20 is sectional view illustrating the FET of FIG. 18 during the large amplitude operation.

FIG. 17 is a sectional view illustrating the FET of FIG. 15 during the operation.

According to the fifth embodiment of the present invention, in the FET with a two-stage recess structure, since the high carrier concentration regions 24 are present in the vicinity of the gate electrode, influences of the surface depletion layer on the device characteristics are significantly reduced. Therefore, the extension of the depletion layer due to surface states during high frequency and large amplitude operation is suppressed, whereby the channel concentration is suppressed.

What is claimed is:

1. A field effect transistor comprising:

a semi-insulating GaAs substrate having a recess;

a gate electrode disposed in the recess;

a low carrier concentration region disposed in said GaAs substrate beneath the gate electrode;

first and second high carrier concentration regions having a higher carrier concentration than the low carrier concentration region disposed in said GaAs substrate at opposite sides of the recess and in contact with the low carrier concentration region;

third and fourth high carrier concentration regions having a higher carrier concentration than the first and second high carrier concentration regions disposed at the surface of the low carrier concentration region in the recess except beneath the gate electrode;

spaced apart source and drain electrodes disposed on the first and second high carrier concentration regions, respectively; and fifth and sixth regions having a carrier concentration higher than that of the first and second high carrier concentration regions, disposed in the first and second high carrier concentration regions, reaching opposite side surfaces of the recess and portions of the first, second, third, and fourth high carrier concentration regions.

2. A field effect transistor comprising:

a semi-insulating GaAs substrate having a surface;

a low carrier concentration GaAs region disposed within said semi-insulating GaAs substrate;

first and second high carrier concentration InGaAs semiconductor regions disposed on the low carrier concentration GaAs region and reaching the surface;

a recess penetrating through portions of the low carrier concentration GaAs region and the first and second high carrier concentration InGaAs regions;

a gate electrode disposed in the recess;

spaced apart source and drain electrodes respectively disposed on the first and second high carrier concentration InGaAs regions; and a high carrier concentration GaAs region disposed on the low carrier concentration region in the recess except beneath the gate electrode.

3. The field effect transistor of claim 2 comprising third and fourth InGaAs regions having a carrier concentration higher than the first and second high carrier concentration InGaAs regions, respectively disposed in the first and second high carrier concentration InGaAs regions and on opposite side surfaces of the recess and an upper surface of the first and second high carrier concentration InGaAs regions except where the source and drain electrodes are present.

4. A field effect transistor including:

a compound semiconductor layer having a first recess with a first depth and a first width in the compound semiconductor layer and a second recess having a width in the compound semiconductor layer wider than the first width and a depth in the compound semiconductor layer shallower than the first depth, the first recess being disposed within the second recess; and a gate electrode disposed in the first recess and contacting the compound semiconductor layer in the first recess wherein the compound semiconductor layer has a first region at and opposite the gate electrode contact of the compound semiconductor layer and having a first majority charge carrier concentration and second regions at and opposite part of the first recess and at and opposite the second recess, the second regions having a second majority charge carrier concentration larger than the first majority charge carrier concentration, the second regions being contiguous to the first region.

5. The field effect transistor of claim 4 wherein the compound semiconductor layer includes source and drain regions on opposite sides of the second recess, respectively contacting respective second regions, the source and drain regions having a third majority charge carrier concentration wherein the third majority charge carrier concentration is smaller than the first and second majority charge carrier concentrations.

6. The field effect transistor of claim 5 including first and second contacting layers respectively contacting the source and drain regions, and source and drain electrodes respectively contacting the first and second contacting layers wherein the first and second contacting layers have a majority charge carrier concentration larger than the third majority charge carrier concentration.

* * * * *